(12) United States Patent
Hirota et al.

(10) Patent No.: US 6,187,623 B1
(45) Date of Patent: Feb. 13, 2001

(54) METHOD OF MANUFACTURING SEMICONDUCTOR DEVICE

(75) Inventors: Toshiyuki Hirota; Kenji Okamura; Fumihide Sato, all of Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/187,488

(22) Filed: Nov. 6, 1998

(30) Foreign Application Priority Data

Nov. 7, 1997 (JP) .................................................... 9-305530

(51) Int. Cl.$^7$ ................................................ H01L 21/8242
(52) U.S. Cl. .................. 438/253; 438/396; 438/666; 438/740; 438/255; 438/398
(58) Field of Search .................................... 438/253, 255, 438/396, 398, 665, 669, 666, 720, 740, 734, 964, 970, FOR 212, FOR 220

(56) References Cited

U.S. PATENT DOCUMENTS

| 5,043,292 | * | 8/1991 | Aronowitz et al. . |
| 5,380,673 | * | 1/1995 | Yang et al. . |
| 5,413,950 |   | 5/1995 | Chen et al. . |
| 5,837,580 | * | 11/1998 | Thakur et al. . |
| 5,946,566 | * | 8/1999 | Choi . |

FOREIGN PATENT DOCUMENTS

| 2312989   | 11/1997 | (GB) . |
| 5-218333  | 8/1993  | (JP) . |
| 8-37240   | 2/1996  | (JP) . |

OTHER PUBLICATIONS

Wolf, Stanley. Silicon Processing for the VLSI Era, vol. 1 Process Technology. Lattice Press. Sunset Beach, California. p. 567, Jun. 1990.*

* cited by examiner

Primary Examiner—George Fourson
Assistant Examiner—Barbara Elizabeth Abbott
(74) Attorney, Agent, or Firm—Foley & Lardner (57) ABSTRACT

In a method of manufacturing a semiconductor device in which a capacitor having a storage electrode is formed on a semiconductor substrate, silicon films are formed on the semiconductor substrate and at the same time first and second endpoint marker layers for dividing the silicon films into three parts in the direction of thickness are formed by using a material different from the material of the silicon films. The silicon films including the first and second endpoint marker layers are etched. The etching depth of the silicon films is controlled based on the type of etched material, thereby forming the storage electrode.

18 Claims, 7 Drawing Sheets

METHOD OF MANUFACTURING SEMICONDUCTOR DEVICE

BACKGROUND OF THE INVENTION

The present invention relates to a method of manufacturing a semiconductor device having a cylindrical capacitor.

To increase the memory capacity, a memory device having a cylindrical capacitor has conventionally been proposed in, e.g., Japanese Patent Laid-Open No. 5-218333. In this memory device, the lower electrode of the capacitor is formed into a cylindrical shape to increase the contact area between the upper and lower electrodes via a dielectric film without increasing the occupied area of the capacitor and to increase the integration degree while ensuring the capacitance of the capacitor. This cylindrical lower electrode is generally called a storage electrode.

FIGS. 4A to 4E show a method of manufacturing a conventional cylindrical capacitor.

Figure 4A:
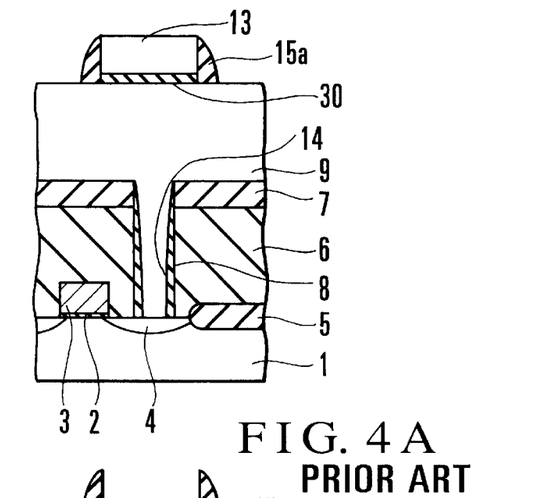
FIGS. 4A to 4E are sectional views, respectively, showing the steps in manufacturing a conventional semiconductor device.

The step in FIG. 4A according to a general manufacturing method will be described briefly. A gate oxide film 2, a gate electrode 3, a diffusion layer 4, and the like are selectively formed on a silicon substrate 1 to constitute an element. FIGS. 4A to 4E show only one element on the substrate 1, but a plurality of elements are practically manufactured. The elements are electrically isolated from each other by element isolation films 5.

An interlevel insulating film 6 and an oxide film 7 are sequentially formed on these elements and the element isolation films 5. Each contact hole 14 is formed in the diffusion layer 4 through the two films. An oxide film 8 is formed on the side surface in the contact hole 14 to improve electrical characteristics.

Simultaneously when the contact hole 14 is filled, a polysilicon film 9 having a predetermined thickness is formed on the oxide film 7. An oxide film 30 having a predetermined width and a polysilicon film 13 are stacked on the silicon film 9. Silicon oxide sidewalls 15a are formed on the sidewalls of the oxide film 30 and silicon film 13.

Figure 4B:
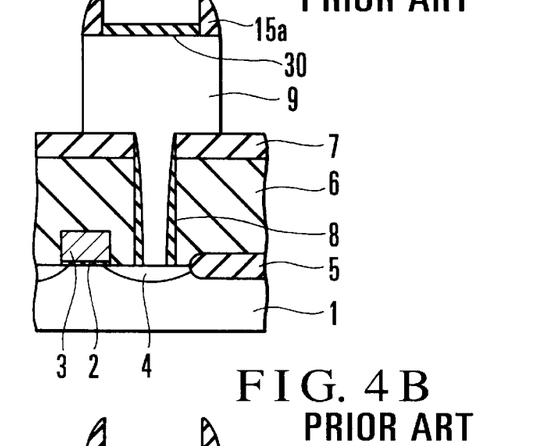

As shown in FIG. 4B, while the silicon film 9 is etched using the oxide film 7 as an etching stopper, the silicon film 13 is etched using the oxide film 30 as an etching stopper.

Figure 4C:
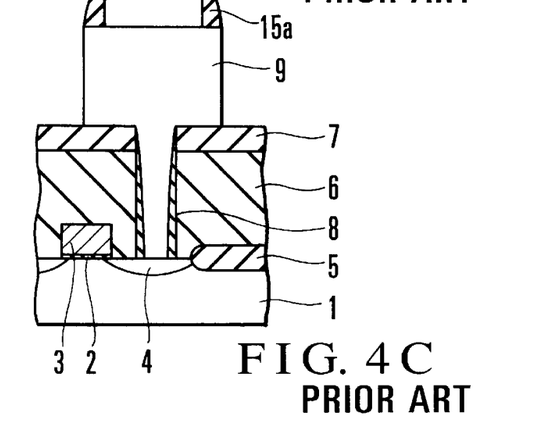

As shown in FIG. 4C, the oxide film 30 is etched away to expose the silicon film 9.

Figure 4D:
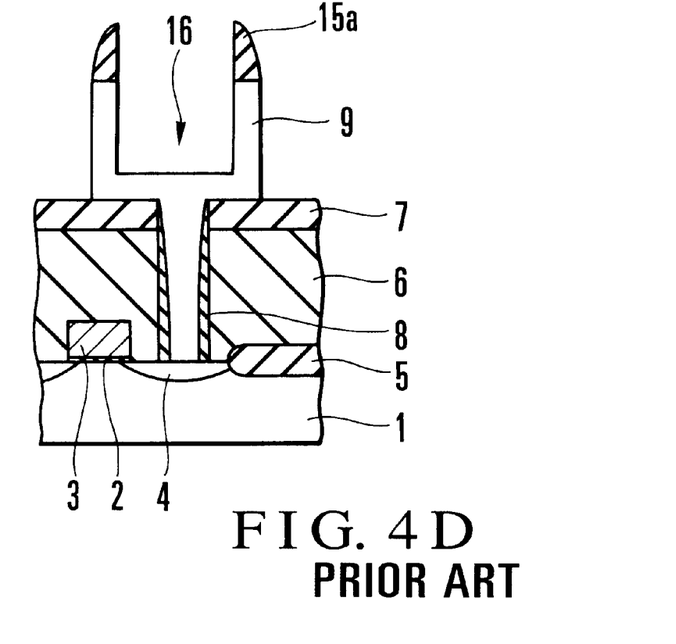

As shown in FIG. 4D, the silicon film 9 is etched to a predetermined thickness on the bottom using the sidewall 15a as an etching mask. Then, a recessed storage electrode 16 whose top is open is formed from the silicon film 9.

Figure 4E:
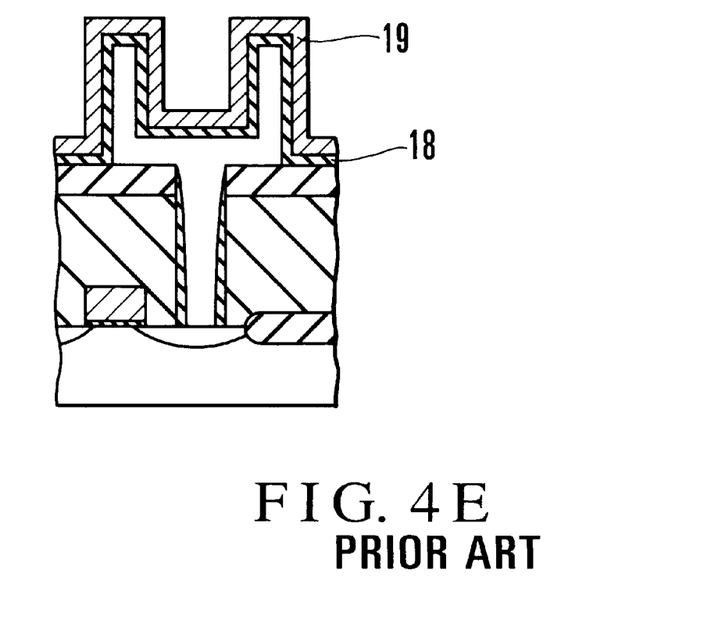

As shown in FIG. 4E, a dielectric layer 18 is formed on the surface of the storage electrode 16, and a cell plate electrode 19 is formed on the dielectric layer 18 to complete the cylindrical capacitor.

In this prior art, the thickness of the silicon film on the bottom of the storage electrode 16 cannot be stably controlled because the endpoint cannot be detected in etching the silicon film 9 in the step of FIG. 4D. If the silicon film on the bottom is too thin, the resistance increases to generate a memory hold error; if the silicon film is too thick, the inner area of the storage electrode 16 decreases to decrease the capacitance of the capacitor.

SUMMARY OF THE INVENTION

It is an object of the present invention to provide a semiconductor device manufacturing method capable of easily controlling the etching depth.

To achieve the above object, according to the present invention, there is provided a method of manufacturing a semiconductor device in which a capacitor having a storage electrode is formed on a semiconductor substrate, comprising the steps of forming silicon films on the semiconductor substrate and at the same time forming when first and second endpoint marker layers for dividing the silicon films into three parts in a direction of thickness by using a material different from a material of the silicon films, etching the silicon films including the first and second endpoint marker layers, and controlling an etching depth of the silicon films based on the type of etched material, thereby forming the storage electrode.

DESCRIPTION OF THE PREFERRED EMBODIMENTS

The present invention will be described below with reference to the accompanying drawings.

FIGS. 1A to 1H show a method of manufacturing a semiconductor device according to the first embodiment of the present invention.

Figure 1A:
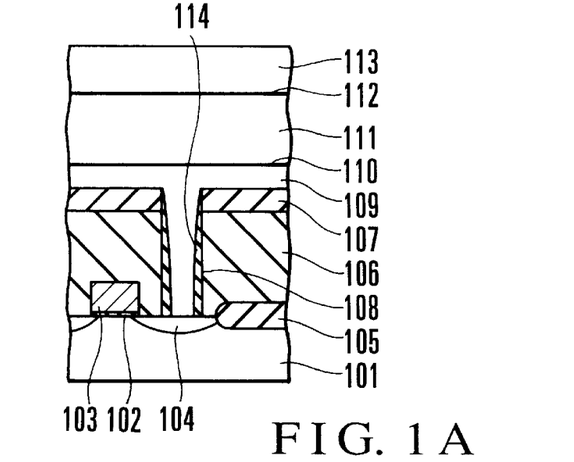
FIGS. 1A to 1H are sectional views, respectively, showing the steps in manufacturing a semiconductor device according to the first embodiment of the present invention.

As shown in FIG. 1A, a gate oxide film 102 is selectively formed on a silicon substrate 101, and a gate electrode 103 is formed on the gate oxide film 102. Using the gate electrode 103 as a mask, diffusion layers 104 are formed on the two side regions of the gate electrode 103 in the silicon substrate 101. The gate oxide film 102, the gate electrode 103, and the diffusion layer 104 constitute an element.

FIGS. 1A to 1H show only one element, but a plurality of elements are practically formed. The elements are electrically isolated from each other by element isolation films 105.

An interlevel insulating film 106 and an undoped oxide film 107 are sequentially formed on these elements and the element isolation films 105. Each contact hole 114 is formed to a depth reaching the diffusion layer 104 through the two films 106 and 107. An oxide film 108 is formed on the inner surface in the contact hole 114 to improve electrical characteristics.

After a native oxide film formed on the diffusion layer 104 at the bottom of the contact hole 114 is removed with dilute hydrofluoric acid, a silicon film 109 having a predetermined thickness is formed on the oxide film 107. At this time, the contact hole 114 is filled with the silicon film 109. An endpoint marker layer 110, a silicon film 111, an endpoint marker layer 112, and a silicon film 113 are sequentially formed on the silicon film 109.

When phosphorus-doped amorphous silicon is to be grown as the silicon films 109, 111, and 113, a gas containing silane gas and phosphine is applied at a growth temperature of 520 to 530° C., a growth pressure of 0.5 to 2.0 Torr, and a P concentration of 1.0e20 atoms/cc or more. The silicon film 113 may be formed from either doped or undoped amorphous silicon. The amorphous silicon film may be grown by PE-CVD (Plasma Enhanced-Chemical Vapor Deposition). When HSG (Hemi-Spherical Grain) is not formed in the succeeding step, the silicon films 109, 111, and 113 may be formed from polysilicon.

The endpoint marker layers 110 and 112 are formed from a silicon oxide film or silicon nitride film about 1 to 2 nm thick by only applying $O_2$ or $NH_3$ gas during the growth of the underlying silicon films 109 and 111. The endpoint marker layers 110 and 112 can also be obtained by introducing $O_2$ gas while stopping the growth of the silicon films 109 and 111, and forming native oxide films on the surfaces of the silicon films 109 and 111. Therefore, the silicon films 109, 111, and 113 can be continuously grown.

Figure 1B:
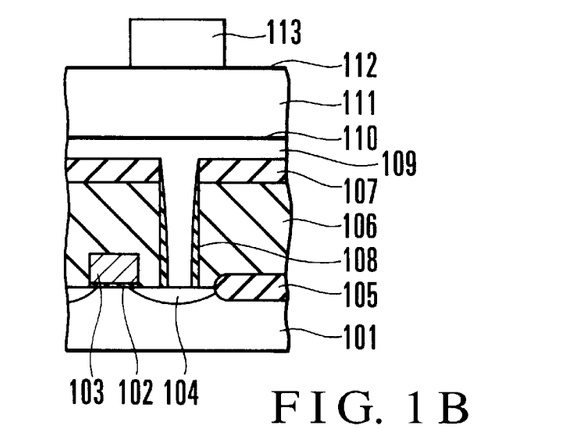

As shown in FIG. 1B, the silicon film 113 is anisotropically dry-etched to leave it by only a predetermined width above the contact hole 114. At this time, light emission of the etched material in the plasma is always monitored to stop etching in accordance with changes in light emission intensity of the material contained in the endpoint marker layer 112 or the like.

When the endpoint marker layer 112 is made of silicon oxide, light emission of oxygen is monitored. The endpoint may be detected by mass spectrometric analysis of the etched material, instead of monitoring the light emission intensity.

Figure 1C:
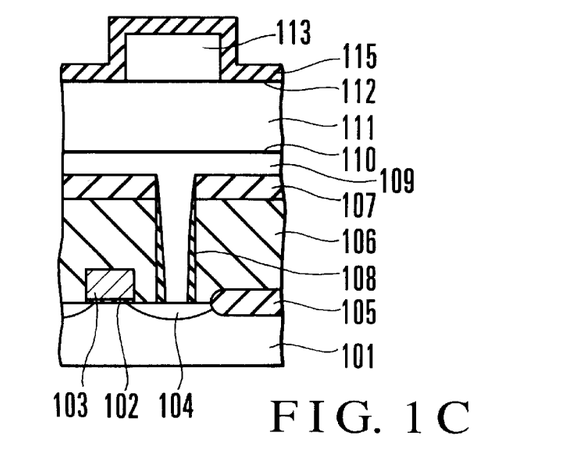

As shown in FIG. 1C, an oxide film 115 is formed on the silicon film 113 and endpoint marker layer 112 by atmospheric pressure CVD or PE-CVD at 500° C. or less. At this time, P or B is used as an impurity to form a BPSG (BoroPhosphoSilicate Glass) oxide film 15.

Figure 1D:
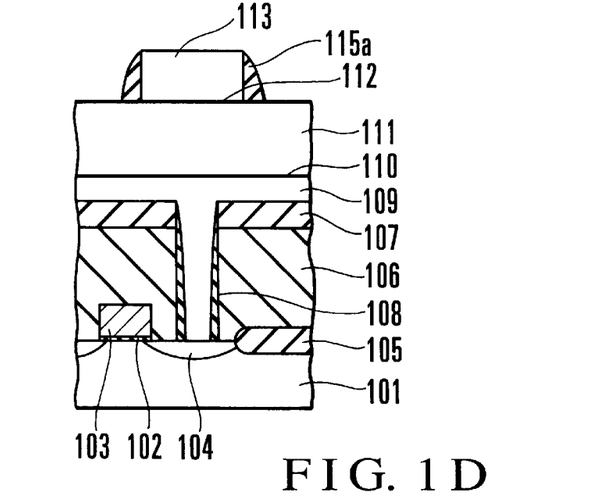

As shown in FIG. 1D, the oxide film 115 is etched back by anisotropic dry etching to form a sidewall 115a on the sidewall of the silicon film 113.

Figure 1E:
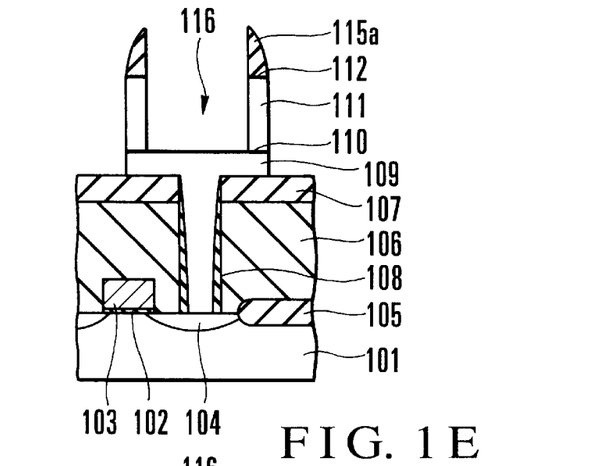

As shown in FIG. 1E, the silicon film 113, endpoint marker film 112, and silicon film 111 are etched using the sidewall 115a as an etching mask. In etching the silicon film 111, light emission of the etched material is always monitored to stop etching in accordance with the light emission intensity of the material contained in the endpoint marker layer 110. At the same time, the silicon film 111, endpoint marker layer 110, and silicon film 109 outside the sidewall 115a are also etched away. As a result, a storage electrode 116 in which the silicon film 109 is left to a predetermined thickness at the bottom is formed.

When the endpoint marker layer 110 is made of silicon oxide, light emission of oxygen is monitored. The endpoint may be detected by mass spectrometric analysis instead of monitoring the light emission intensity.

Figure 1F:
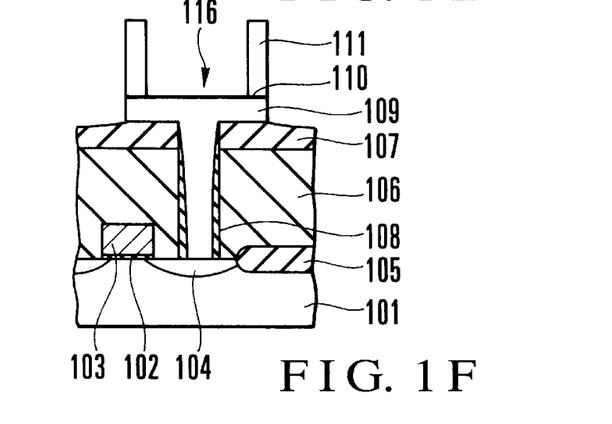

As shown in FIG. 1F, the sidewall 115a is selectively removed. If the oxide film 107 is made of undoped oxide, and the sidewall 115a is made of BPSG, the sidewall 115a can be selectively removed with HF.

Figure 1G:
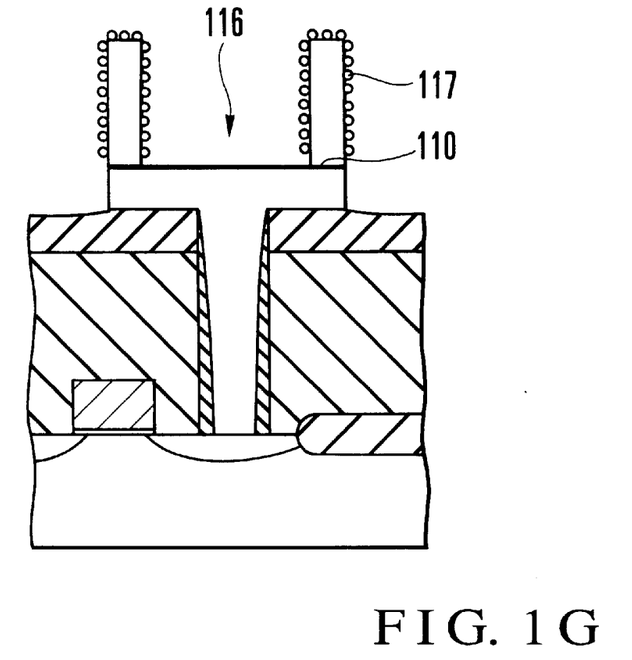

As shown in FIG. 1G, after the native oxide film on the storage electrode 116 is removed with dilute hydrofluoric acid as pre-processing of HSG growth, silane gas is applied at 550 to 600° C. and 1 mTorr or less to deposit nuclei 117 on the surface of the storage electrode 116.

Figure 1H:
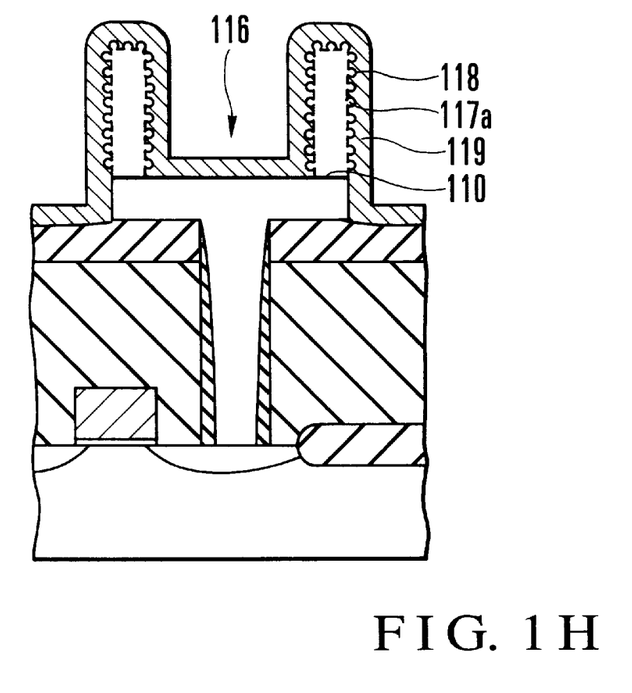

As shown in FIG. 1H, while the nuclei 117 are deposited on the surface of the storage electrode 116, the resultant structure is annealed to grow projecting HSGs 117a. A dielectric film 118 is formed on the surface of the storage electrode 116, and a cell plate electrode 119 is formed to complete the cylindrical capacitor.

Note that HSGs need not always be grown. Like the prior art, the capacitor may be manufactured by forming the dielectric film and cell plate electrode on the storage electrode without growing any HSGs. In this case, the silicon film need not be made of amorphous silicon.

Figure 2A:
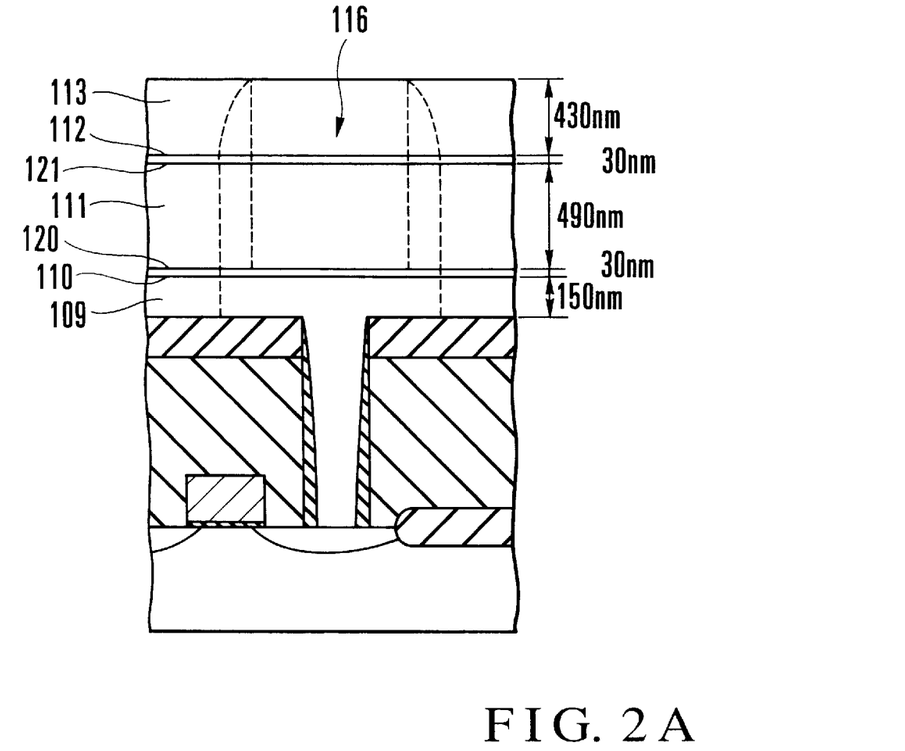
FIGS. 2A and 2B are sectional views, respectively, showing the steps in manufacturing a semiconductor device according to the second embodiment of the present invention.
Figure 2B:
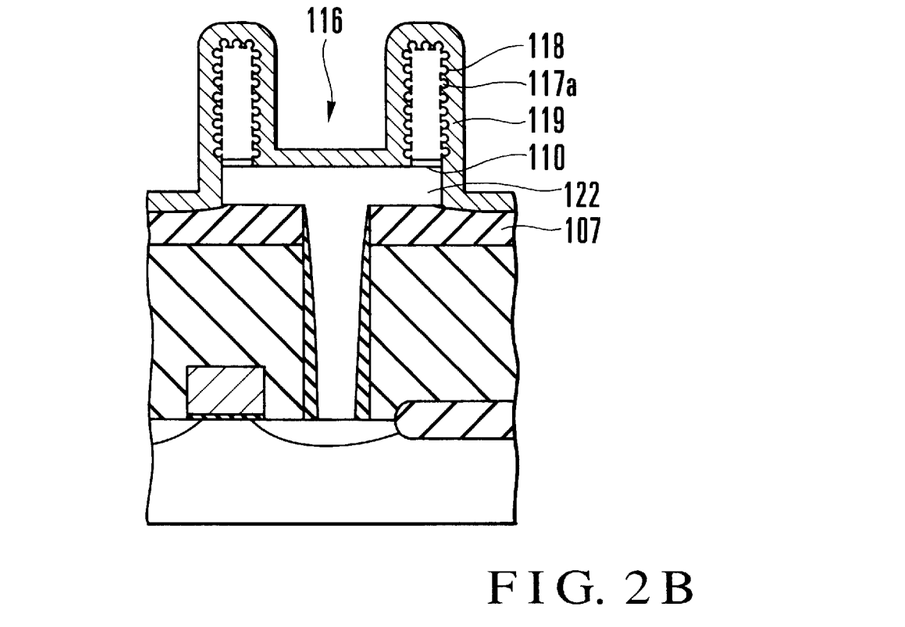

FIGS. 2A and 2B show a method of manufacturing a semiconductor device according to the second embodiment of the present invention. The same reference numerals as in FIGS. 1A to 1H denote the same parts. In the second embodiment, silicon films 109, 111, and 113 are made of doped amorphous silicon in order to decrease the contact resistance and the like. In addition, as shown in FIG. 2A, undoped amorphous silicon films 120 and 121 are respectively formed at the interfaces between endpoint marker layers 110 and 112 and the silicon film 111.

The silicon film 109 has a thickness of 150 nm, the silicon film 111 has a thickness of 490 nm, and the silicon film 113 has a thickness of 430 nm. Each of the undoped amorphous silicon films 120 and 121 has a thickness of 30 nm.

If a heavily doped amorphous silicon film is directly formed on an oxide film, amorphous silicon is easily crystallized from the interface with the oxide film by high temperatures in processes such as film growth, HSG nucleus formation, and HSG annealing. More specifically, as shown in FIG. 2A, the doped amorphous silicon films 109, 111, and 113 may crystallize. When HSGs are grown on the surface of the storage electrode, the silicon film crystallizing to the surface of the storage electrode stops the growth of HSGs.

For this reason, crystallization of particularly the silicon film 111 having the largest surface area in a storage electrode 116 must be prevented.

The present inventors have found that crystallization of the silicon film 111 can be prevented by respectively forming the undoped amorphous silicon films 120 and 121 at the interfaces between the endpoint marker layers 110 and 112 and the silicon film 111.

Consequently, even if the silicon films 109 and 113 in contact with oxide films 107 and 115 may crystallize to polysilicon 122, as shown in FIG. 2B, the silicon film 111 sandwiched between the undoped amorphous silicon films 120 and 121 do not crystallize.

Although the endpoint marker layer 110 is left in the storage electrode 116, the thickness is as small as 1 to 2 nm. The thin endpoint marker layer 110 allows electrons to flow therethrough as a tunnel current, so no parasitic capacitor is formed. The endpoint marker layer 110 having a thickness of 1 nm or more can be reliably detected as an endpoint marker.

How to determine the thicknesses of the undoped amorphous silicon films 120 and 121 will be explained.

Figure 3:
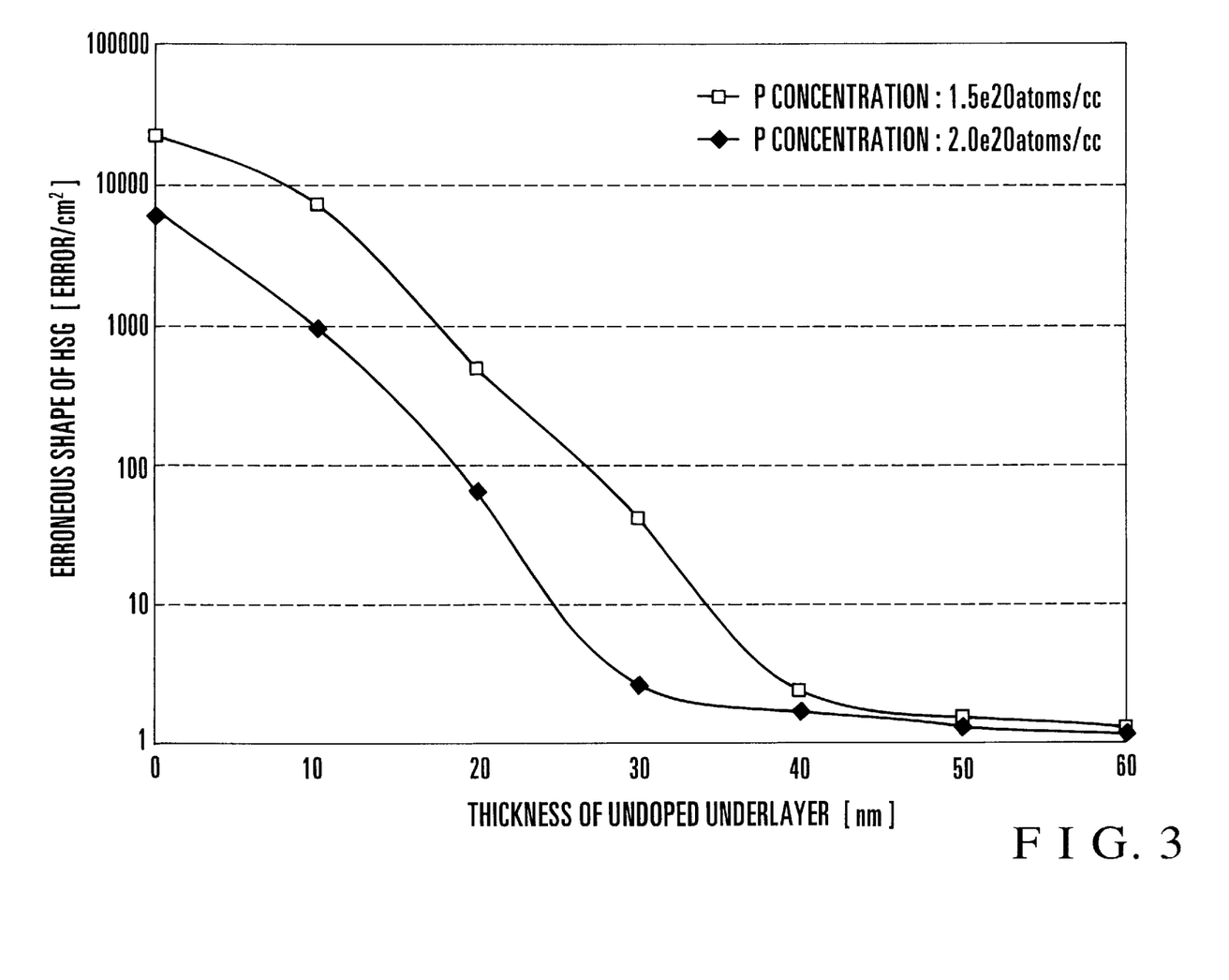
FIG. 3 is a graph showing the thickness of the undoped amorphous silicon film and an erroneous shape of the HSG formed on it.

FIG. 3 shows the relationship between the thickness of the undoped amorphous silicon film and an erroneous shape of the HSG formed on it. As shown in FIG. 3, if the undoped amorphous silicon films 120 and 121 are formed with a thickness of about 30 nm or more depending on the P concentration of the doped amorphous silicon underlayer, the erroneous shape of the HSG can be prevented.

Examples according to the present invention will be explained. The silicon films 109 and 113 in examples 1 to 3 are formed by LP-CVD, whereas the silicon film 113 in example 4 is formed by plasma CVD.

[Example 1]

The materials and thicknesses of the respective layers were as follows.

Silicon film 113:

doped amorphous silicon film (430 nm)

Endpoint marker layer 112:

silicon oxide film (1 to 2 nm)

Undoped amorphous silicon film 121:

undoped amorphous silicon film (30 nm)

Silicon film 111:

doped amorphous silicon film (490 nm)
Undoped amorphous silicon film 120:
undoped amorphous silicon film (30 nm)
Endpoint marker layer 110:
silicon oxide film (1 to 2 nm)
Silicon film 109:
doped amorphous silicon film (150 nm)

The method of monitoring the light emission intensity was as follows. Both the endpoint marker layers 110 and 112 could be detected by any one of methods (1) to (3).

(1) Light emission of oxygen was monitored, and a portion where the intensity increased was determined as an endpoint. The wavelengths of light to be monitored were 437, 497, 502, 533, 544, 605, 616, 646, 700, 725, and 777 nm.

(2) Light emission of $SiO_2$ was monitored, and a portion where the intensity increased was determined as an endpoint. The wavelengths of light to be monitored were 241, 234, and 249 nm.

(3) The difference in P concentration between the undoped layer and the doped layer was used. That is, light emission of P was monitored, and a portion where the intensity decreased was determined as an endpoint. The wavelengths of light to be monitored were 214 and 253 nm.

The monitoring method by mass spectrometric analysis was as follows. Both the endpoint marker layers 110 and 112 could be detected by any one of methods (1) to (4).

(1) The oxygen atom O was monitored with mass number "16", and a portion where the intensity increased was determined as an endpoint.

(2) $SiO_2$ was monitored with mass number "60", and a portion where the intensity increased was determined as an endpoint.

(3) The difference in P concentration between the undoped layer and the doped layer was used. That is, P was monitored with mass number "31", and a portion where the intensity decreased was determined as an endpoint.

(4) The difference in SiP concentration between the undoped layer and the doped layer was used. That is, SiP was monitored with mass number "59", and a portion where the intensity decreased was determined as an endpoint.

[Example 2]

The materials and thicknesses of the respective layers were as follows.
Silicon film 113:
undoped amorphous silicon film (430 nm)
Endpoint marker layer 112:
silicon oxide film (1 to 2 nm)
Undoped amorphous silicon film 121:
undoped amorphous silicon film (30 nm)
Silicon film 111:
doped amorphous silicon film (490 nm)
Undoped amorphous silicon film 120:
undoped amorphous silicon film (30 nm)
Endpoint marker layer 110:
silicon oxide film (1 to 2 nm)
Silicon film 109:
doped amorphous silicon film (150 nm)

The method of monitoring the light emission intensity was as follows.

(1) Light emission of oxygen was monitored, and a portion where the intensity increased was determined as an endpoint. The wavelengths of light to be monitored were 437, 497, 502, 533, 544, 605, 616, 646, 700, 725, and 777 nm.

(2) Light emission of $SiO_2$ was monitored, and a portion where the intensity increased was determined as an endpoint. The wavelengths of light to be monitored were 241, 234, and 249 nm.

(3) The difference in P concentration between the undoped layer and the doped layer was used. That is, for detection of the endpoint marker layer 112, light emission of P was monitored, and a portion where the intensity increased was determined as an endpoint. For detection of the endpoint marker layer 110, light emission of P was monitored, and a portion where the intensity decreased was determined as an endpoint. The wavelengths of light to be monitored were 214 and 253 nm.

The monitoring method by mass spectrometric analysis was as follows.

(1) The oxygen atom O was monitored with mass number "16", and a portion where the intensity increased was determined as an endpoint.

(2) $SiO_2$ was monitored with mass number "60", and a portion where the intensity increased was determined as an endpoint.

(3) The difference in P concentration between the undoped layer and the doped layer was used. That is, for detection of the endpoint marker layer 112, P was monitored with mass number "31", and a portion where the intensity increased was determined as an endpoint.

(4) The difference in SiP concentration between the undoped layer and the doped layer was used. That is, for detection of the endpoint marker layer 110, SiP was monitored with mass number "59", and a portion where the intensity increased was determined as an endpoint.

[Example 3]

The materials and thicknesses of the respective layers were as follows.
Silicon film 113:
undoped amorphous silicon film (430 nm)
Endpoint marker layer 112:
silicon nitride film (1 to 2 nm)
Undoped amorphous silicon film 121:
undoped amorphous silicon film (30 nm)
Silicon film 111:
doped amorphous silicon film (490 nm)
Undoped amorphous silicon film 120:
undoped amorphous silicon film (30 nm)
Endpoint marker layer 110:
silicon nitride film (1 to 2 nm)
Silicon film 109:
doped amorphous silicon film (150 nm)

The method of monitoring the light emission intensity was as follows.

(1) Light emission of SiN was monitored, and a portion where the intensity increased was determined as an endpoint. The wavelengths of light to be monitored were 441, 405, 409, 413, 420, and 424 nm.

(2) For detection of the endpoint marker layer 112, light emission of CN was monitored, and a portion where the intensity increased was determined as an endpoint. The wavelengths of light to be monitored were 387, 418, 647, 693, 709, and 785 nm. Note that C in CN is supplied from the resist during the manufacture.

The monitoring method by mass spectrometric analysis was as follows.

(1) The nitrogen atom N was monitored, and a portion where the intensity increased was determined as an endpoint.

(2) SiN was monitored, and a portion where the intensity increased was determined as an endpoint.

(3) The difference in SiP concentration between the undoped layer and the doped layer was used. That is, for detection of the endpoint marker layer 112, SiP was monitored, and a portion where the intensity decreased was determined as an endpoint.

(4) The difference in P concentration between the undoped layer and the doped layer was used. That is, for detection of the endpoint marker layer 112, P was monitored, and a portion where the intensity increased was determined as an endpoint.

[Example 4]

The materials and thicknesses of the respective layers were as follows.

Silicon film 113:
plasma-CVD undoped amorphous silicon film (430 nm)
Endpoint marker layer 112:
native oxide film (1 to 2 nm)
Undoped amorphous silicon film 121:
undoped amorphous silicon film (30 nm)
Silicon film 111:
doped amorphous silicon film (490 nm)
Undoped amorphous silicon film 120:
undoped amorphous silicon film (30 nm)
Endpoint marker layer 110:
silicon oxide film (1 to 2 nm)
Silicon film 109:
doped amorphous silicon film (150 nm)

The method of monitoring the light emission intensity was as follows.

(1) Light emission of oxygen was monitored, and a portion where the intensity increased was determined as an endpoint. The wavelengths of light to be monitored were 437, 497, 502, 533, 544, 605, 616, 646, 700, 725, and 777 nm.

(2) Light emission of $SiO_2$ was monitored, and a portion where the intensity increased was determined as an endpoint. The wavelengths of light to be monitored were 241, 234, and 249 nm.

(3) The difference in P concentration between the undoped layer and the doped layer was used. That is, for detection of the endpoint marker layer 112, light emission of P was monitored, and a portion where the intensity increased was determined as an endpoint. For detection of the endpoint marker layer 110, light emission of P was monitored, and a portion where the intensity decreased was determined as an endpoint. The wavelengths of light to be monitored were 214 and 253 nm.

The monitoring method by mass spectrometric analysis was as follows.

(1) The oxygen atom O was monitored with mass number "16", and a portion where the intensity increased was determined as an endpoint.

(2) $SiO_2$ was monitored with mass number "60", and a portion where the intensity increased was determined as an endpoint.

(3) The difference in P concentration between the undoped layer and the doped layer was used. That is, for detection of the endpoint marker layer 112, P was monitored with mass number "31", and a portion where the intensity increased was determined as an endpoint.

(4) The difference in SiP concentration between the undoped layer and the doped layer was used. That is, for detection of the endpoint marker layer 110, SiP was monitored with mass number "59", and a portion where the intensity increased was determined as an endpoint.

In Example 4, since the undoped amorphous silicon film is formed by plasma CVD, it can be grown at a lower temperature than in LP-CVD, the thermal hysteresis is small in forming the silicon film 113 serving as a sacrificial silicon film, and crystallization hardly occurs in the storage electrode 116.

Etching conditions in Examples 1 to 4 are as follows.
Etching apparatus:
parallel plate reactive ion etching apparatus
Pressure: 100 mTorr
Inter-electrode gap: 80 mm
$Cl_2$: 150 sccm
HBr: 450 sccm
$O_2$: 5 sccm
Top-side power: 500 W
Bottom-side power: 300 W As has been described above, according to the present invention, since the endpoint marker layer is formed inside the storage electrode in HSG growth, the etching depth can be stably controlled.

Since the endpoint marker layer is etched away together with the silicon film in processing the storage electrode, no additional removal step is required.

By forming undoped amorphous silicon films at two portions inside the silicon film, crystallization of the amorphous silicon film sandwiched between the two films can be prevented to avoid an erroneous shape of the HSG.

What is claimed is:

1. A method of manufacturing a semiconductor device in which a capacitor having a storage electrode is formed on a semiconductor substrate, comprising the steps of:

forming silicon films on the semiconductor substrate and at the same time forming first and second endpoint marker layers for dividing the silicon films into three parts in a direction of thickness by using a material different from a material of the silicon films;

etching the silicon films including the first and second endpoint marker layers; and controlling an etching depth of the silicon films based on the type of etched material, thereby forming the storage electrode.

2. A method according to claim 1, wherein the step of controlling the etching depth comprises the step of stopping etching when concentrations of materials of the first and second endpoint marker layers in the etched material reach a value.

3. A method according to claim 1, wherein each of the first and second endpoint marker layers do not function as etch-stop layers.

4. A method according to claim 3, wherein each of the first and second endpoint marker layers is made of a silicon oxide film having a thickness of 1 to 2 nm.

5. A method according to claim 1, wherein the step of controlling the etching depth comprises the steps of:

monitoring a light emission state of the etched material; and controlling the etching depth based on a monitoring result.

6. A method according to claim 1, wherein the step of controlling the etching depth comprises the steps of:

monitoring a mass of the etched material; and controlling the etching depth based on a monitoring result.

7. A method according to claim 1, wherein the storage electrode is made of either one of polysilicon and amorphous silicon.

8. A method of manufacturing a semiconductor device, comprising the steps of:

forming a semiconductor element on a semiconductor substrate;

forming an interlevel insulating film on the semiconductor element;

forming a contact hole in the interlevel insulating film to reach the semiconductor substrate;

forming a first silicon film on the interlevel insulating film to fill the contact hole with the first silicon film;

forming a first endpoint marker layer on the first silicon film from a material different from a material of the first silicon film;

forming a second silicon film on the first endpoint marker layer;

forming a second endpoint marker layer on the second silicon film from a material different from a material of a storage electrode;

forming a third silicon film on the second endpoint marker layer;

etching the third silicon film to form a fourth silicon film having a width above the contact hole, the etching being controlled in accordance with changes in type of etched material;

forming a sidewall from silicon oxide on a sidewall of the fourth silicon film; and etching the second and fourth silicon films using the sidewall as a mask, and forming an opening in the second silicon film to form a storage electrode, the etching being controlled in accordance with changes in type of etched material.

9. A method according to claim 8, further comprising the steps of:

forming a dielectric film on a surface of the storage electrode after removing the sidewall; and forming a cell plate electrode on the dielectric film.

10. A method according to claim 8, wherein each of the first and second endpoint marker layers do not function as etch-stop layers.

11. A method according to claim 10, wherein each of the first and second endpoint marker layers is made of a silicon oxide film having a thickness of 1 to 2 nm.

12. A method according to claim 8, wherein the step of etching the second silicon film comprises the step of stopping etching when a concentration of the material of the first endpoint marker layer in the etched material reaches a value, and the step of etching the third silicon film comprises the step of stopping etching when a concentration of the material of the second endpoint marker layer in the etched material reaches a predetermined value.

13. A method according to claim 8, wherein the first, second, and third silicon films are made of doped amorphous silicon containing an impurity.

14. A method according to claim 13, wherein the impurity is phosphorus.

15. A method according to claim 8, wherein the third silicon film is made of undoped amorphous silicon.

16. A method according to claim 8, further comprising the step of forming hemi-spherical grains (HSGs) on a surface of the storage electrode.

17. A method according to claim 16, further comprising the steps of:

forming an undoped amorphous silicon film having a thickness at an interface between the first endpoint marker layer and the second silicon film; and forming an undoped amorphous silicon film having a thickness at an interface between the second silicon film and the second endpoint marker layer.

18. A method according to claim 17, wherein each of the undoped amorphous silicon films has a thickness of at least 30 nm.

* * * * *